United States Patent [19]
Park

[11] Patent Number: 6,051,850
[45] Date of Patent: *Apr. 18, 2000

[54] INSULATED GATE BIPOLAR JUNCTION TRANSISTORS HAVING BUILT-IN FREEWHEELING DIODES THEREIN

[75] Inventor: Jae-Hong Park, Kyungki-do, Rep. of Korea

[73] Assignee: Fairchild Korea Semiconductor Ltd., Puchon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/948,735

[22] Filed: Oct. 10, 1997

Related U.S. Application Data

[62] Division of application No. 08/695,168, Aug. 8, 1996, Pat. No. 5,702,961.

[30] Foreign Application Priority Data

Dec. 30, 1995 [KR] Rep. of Korea ............. 95-68649

[51] Int. Cl.[7] .................. H01L 29/74; H01L 31/111
[52] U.S. Cl. ................. 257/133; 257/134; 257/135; 257/146
[58] Field of Search .................. 257/133, 134, 257/135, 139, 140, 143, 144, 146

[56] References Cited

U.S. PATENT DOCUMENTS

| | | | |
|---|---|---|---|
| 4,630,092 | 12/1986 | Bhagat | 257/135 |
| 4,669,177 | 6/1987 | D'Arrigo et al. | 29/571 |
| 4,811,072 | 3/1989 | Risberg | 257/133 |
| 4,963,502 | 10/1990 | Teng et al. | 437/41 |
| 4,965,710 | 10/1990 | Pelly et al. | 363/56 |
| 5,006,476 | 4/1991 | De Jong et al. | 437/31 |
| 5,105,244 | 4/1992 | Bauer | 257/133 |
| 5,141,889 | 8/1992 | Terry et al. | 437/40 |
| 5,155,289 | 10/1992 | Bowles | 89/8 |
| 5,162,966 | 11/1992 | Fujihira | 257/140 |

(List continued on next page.)

*Primary Examiner*—Mahshid Saadat
*Assistant Examiner*—Jesse A. Fenty
*Attorney, Agent, or Firm*—Grant J. Scott; Pierce Atwood; Chris A. Caseiro

[57] ABSTRACT

Methods of forming power semiconductor devices having insulated gate bipolar transistor cells and freewheeling diodes cells therein includes the steps of forming an array of emitter regions of second conductivity type (e.g., P-type) in a cathode layer of first conductivity type (e.g., N-type) and then forming a base region of first conductivity type on the cathode layer. An insulated gate electrode(s) pattern is then formed on a surface of the base region and used as an implant mask for forming interleaved arrays of collector and anode regions of second conductivity type in the base region. An array of source regions of first conductivity type is then formed in the collector regions, but not the anode regions, by implanting/diffusing source region dopants into the collector regions. To achieve preferred device characteristics, the array of collector regions is formed to be diametrically opposite the array of emitter regions to thereby define a plurality of vertical IGBT cells. The array of anode regions is also spaced between adjacent collector regions to define a plurality of freewheeling diode cells which are connected in antiparallel relative to the IGBT cells. The insulated gate electrode is also preferably patterned to extend between adjacent collector and anode regions so that in the event parasitic thyristor latch-up of the IGBT cells occurs, the collector regions can be electrically connected to the anode regions. This electrical connection reduces the effective resistance of the collector regions and reduces the likelihood that the P-N junction formed at the collector-source junction will become or remain forward biased.

6 Claims, 4 Drawing Sheets

U.S. PATENT DOCUMENTS

| | | | |
|---|---|---|---|
| 5,270,230 | 12/1993 | Sakurai | 148/DIG. 126 |
| 5,273,917 | 12/1993 | Sakurai | 437/40 |
| 5,274,541 | 12/1993 | Kimura et al. | 363/56 |
| 5,331,184 | 7/1994 | Kuwahara | 257/139 |
| 5,348,896 | 9/1994 | Jang et al. | 437/59 |
| 5,349,230 | 9/1994 | Shigekane | 257/474 |
| 5,360,984 | 11/1994 | Kirihata | 257/143 |
| 5,407,847 | 4/1995 | Hayden et al. | 437/162 |
| 5,469,103 | 11/1995 | Shigekane | 327/478 |
| 5,485,022 | 1/1996 | Matsuda | 257/133 |
| 5,485,023 | 1/1996 | Sumida | 257/139 |
| 5,508,534 | 4/1996 | Nakamura et al. | 257/135 |
| 5,608,238 | 3/1997 | Matsuda | 257/139 |
| 5,643,810 | 7/1997 | Jang | 437/31 |
| 5,698,867 | 12/1997 | Bauer et al. | 257/138 |
| 5,757,033 | 5/1998 | Ajit | 257/120 |

INSULATED GATE BIPOLAR JUNCTION TRANSISTORS HAVING BUILT-IN FREEWHEELING DIODES THEREIN

This application is a divisional of application Ser. No. 08/695,168, filed Aug. 8, 1996, now U.S. Pat. No. 5,702, 961.

FIELD OF THE INVENTION

The present invention relates to semiconductor devices and fabrication methods, and more particularly to power semiconductor devices and fabrication methods.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. As a result, the device's operating forward current density is limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. Classes of such hybrid devices include various types of MOS-gated thyristors as well as the insulated gate bipolar transistor (IGBT), also commonly referred to by the acronyms COMFET (Conductivity-Modulated FET) and BIFET (Bipolar-mode MOSFET).

Examples of insulated gate bipolar transistors are described in U.S. Pat. No. 5,273,917 to Sakurai; U.S. Pat. No. 5,331,184 to Kuwahara; U.S. Pat. No. 5,360,984 to Kirihata; U.S. Pat. Nos. 5,396,087 and 5,412,228 to B. J. Baliga; U.S. Pat. No. 5,485,022 to Matsuda; U.S. Pat. No. 5,485,023 to Sumida; U.S. Pat. No. 5,488,236 to Baliga et al.; and U.S. Pat. No. 5,508,534 to Nakamura et al. In particular, U.S. Pat. No. 5,360,984 to Kirihata discloses a semiconductor substrate containing an IGBT therein and a freewheeling/flyback diode for, among other things, bypassing parasitic reverse voltage surges which are typical in inductive power circuit applications. However, the antiparallel-connected freewheeling diode disclosed by Kirihata increases the area occupied by the IGBT and may cause an unnecessary stray inductance due to the wiring which interconnects the IGBT with the freewheeling diode. Moreover, the IGBT of Kirihata may be susceptible to sustained parasitic thyristor latch-up.

Thus, notwithstanding these attempts to form IGBTs, there still continues to be a need for methods of forming highly integrated power semiconductor devices comprising IGBTs which are capable of bypassing parasitic reverse voltage surges, typical in inductive power circuit applications, and have reduced susceptibility to sustained parasitic thyristor latch-up.

SUMMARY OF THE INVENTION

It is therefore an object of the present invention to provide improved methods of forming power semiconductor devices, and devices formed thereby.

It is another object of the present invention to provide methods of forming highly integrated power semiconductor devices containing insulated gate bipolar transistor cells and freewheeling diode cells therein, and devices formed thereby.

It is a further object of the present invention to provide methods of forming insulated gate bipolar transistors having freewheeling diodes for supporting reverse-voltage surges and means for providing reduced susceptibility to uncontrolled parasitic thyristor latch-up, and devices formed thereby.

These and other objects, features and advantages of the present invention are provided by methods which allow for simultaneous formation of insulated gate bipolar transistors (IGBTs) and freewheeling/flyback diodes at high integration densities in a common semiconductor substrate. In particular, a preferred method includes the steps of forming an array of emitter regions of second conductivity type (e.g., P-type) in a cathode layer of first conductivity type (e.g., N-type) and then forming a base region of first conductivity type on the cathode layer. An insulated gate electrode(s) pattern is then formed on a surface of the base region and used as an implant mask for forming interleaved arrays of collector and anode regions of second conductivity type in the base region. An array of source regions of first conductivity type is then formed in the collector regions, but not the anode regions, by implanting/diffusing source region dopants into the collector regions. To achieve preferred device characteristics, the array of collector regions is formed to be diametrically opposite the array of emitter regions to thereby define a plurality of vertical IGBT cells. The array of anode regions is also spaced between adjacent collector regions to define a plurality of freewheeling diode cells which are connected in antiparallel relative to the IGBT cells.

The insulated gate electrode is also preferably patterned to extend between adjacent collector and anode regions so that in the event parasitic thyristor latch-up of the IGBT cells occurs, the collector regions can be electrically connected to the anode regions. This electrical connection reduces the effective resistance of the collector regions and reduces the likelihood that the P-N junction formed at the collector-source junction will become or remain forward biased. After formation of the source regions, electrodes to the IGBT cells and diode cells are formed to the source, collector and anode regions and to the cathode layer and emitter regions. However, according to one embodiment of the present invention, the step of forming an electrode to the emitter regions and cathode layer is preceded by the step of chemically/mechanically polishing the cathode layer to expose the emitter regions.

DESCRIPTION OF PREFERRED EMBODIMENTS

Figure 1:
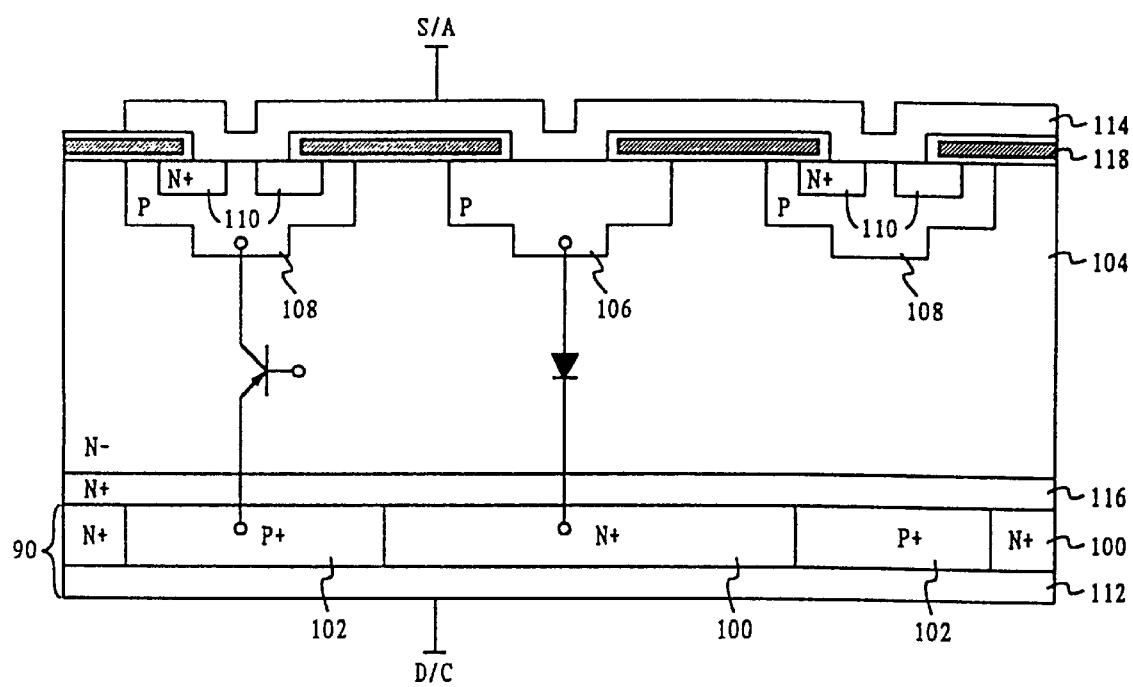
FIG. 1 illustrates a schematic cross-sectional view of an integrated power semiconductor device containing IGBT cells and diode cells in antiparallel, according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Referring now to FIG. 1, an integrated power semiconductor device having interleaved arrays of vertical insulated-gate bipolar transistor cells and antiparallel-connected freewheeling/flyback diode cells, will be described. In particular, the power semiconductor device comprises a semiconductor substrate having opposing top and bottom faces. In the substrate, a base region of first conductivity type (e.g., N-type) is provided. The base region preferably comprises a relatively highly doped buffer region 116 and a more lightly doped drift region 104 thereon, extending to the top face of the substrate. At the bottom face, a first layer 90 comprising a cathode region 100 of first conductivity type (shown as N+) and an array of emitter regions 102 of second conductivity type (shown as P+) therein, is provided. The emitter regions 102 may be of stripe-shaped geometry or of circular or polygonal-shaped geometry (e.g., square, hexagonal). Thus, the array of emitter regions 102 may comprise a one-dimensional array of parallel stripe-shaped fingers or a two-dimensional array of circular or polygonal-shaped regions at the bottom face of the substrate, for example. An emitter/cathode electrode 112 is also preferably provided at the bottom face, in ohmic contact with the emitter and cathode regions.

At the top face of the substrate, an array of collector regions 108 is provided. The array of collector regions 108 is preferably positioned diametrically opposite the array of emitter regions 102 so that each of the collector regions extends diametrically opposite a respective emitter region to thereby define a respective vertical bipolar junction transistor, as schematically illustrated. The base region also includes an array of anode regions 106 of second conductivity type therein, at the top face. The array of anode regions 106 is preferably interleaved with the array of collector regions 108 so that the anode regions 106 do not extend opposite respective emitter regions 102. Instead, the array of anode regions 106 define an array of spaced vertical diode cells between respective anode regions 106 and the cathode region 100, as schematically illustrated. An array of source regions 110 of first conductivity type is also provided in the array of collector regions 108, but not in the array of anode regions 106. The source regions 110 may be of annular, stripe, polygonal or similar shape.

Insulated gate electrode means 118, preferably comprising a gate electrode spaced from the top face of the base region by a gate insulating layer (e.g., $SiO_2$), is also provided on the top face, for electrically connecting the array of source regions 110 to the drift region 104 in response to application of a predetermined forward bias to the gate electrode (e.g., $V_{gate} \geq V_{th}$, where $V_{th}$ is the voltage needed to form a first conductivity type inversion layer channel in the collector region 108, at the top face). Finally, a source/collector/anode electrode 114 is provided on the top face, in ohmic contact with the source, collector and anode regions. Accordingly, power semiconductor devices according to the present invention comprise IGBT cells and antiparallel-connected diode cells. These cells are preferably arranged as interleaved arrays of cells so that when viewed in transverse cross-section, the IGBT cells and diode cells alternate in sequence.

According to an additional feature of the present invention, the anode regions 106 of the highly integrated diode cells can also be used to increase the likelihood of turn-off of the IGBT cells when the forward gate bias (i.e., $V_{gate} \geq V_{th}$) applied to the insulated gate electrode means 118 is removed, by reducing the possibility of regenerative conduction (i.e., latch-up) in the parasitic thyristor formed by the emitter, base, collector and source regions. In particular, to increase the rate at which the IGBT cells can be turned-off and to reduce the likelihood of parasitic thyristor conduction, the gate bias $V_{gate}$ can be reversed (e.g., $V_{gate} < 0$ Volts). If the reverse bias is sufficient, second conductivity type inversion layer channels will be formed at the top face of the base region. These inversion layer channels provide electrical "shorts" between adjacent collector and anode regions. By electrically connecting the collector regions to the anode regions, the inversion layer channels lower the effective lateral resistance of the collector regions by providing an alternative path for second conductivity type charge carriers (e.g., holes) in the collector regions to flow to the electrode 114 at the top face. As will be understood by those skilled in the art, providing an alternative current path to reduce the current densities in the collector regions reduces the likelihood that the collector/ source P-N junction will become or remain forward biased. This reduces the likelihood of sustained parasitic thyristor latch-up. Accordingly, insulated gate electrode means 118 also comprises means for electrically connecting adjacent collector and anode regions in response to application of a predetermined reverse bias thereto.

Figure 2:
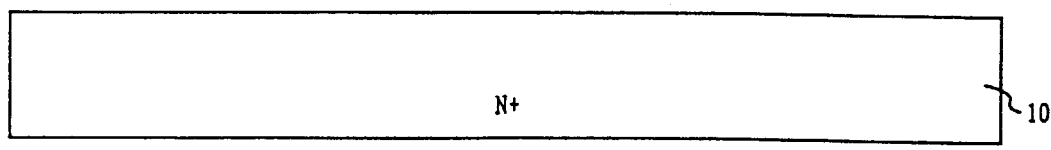
FIGS. 2–7 illustrate schematic cross-sectional views of intermediate structures illustrating a method of forming the integrated power semiconductor device of FIG. 1.
Figure 3:
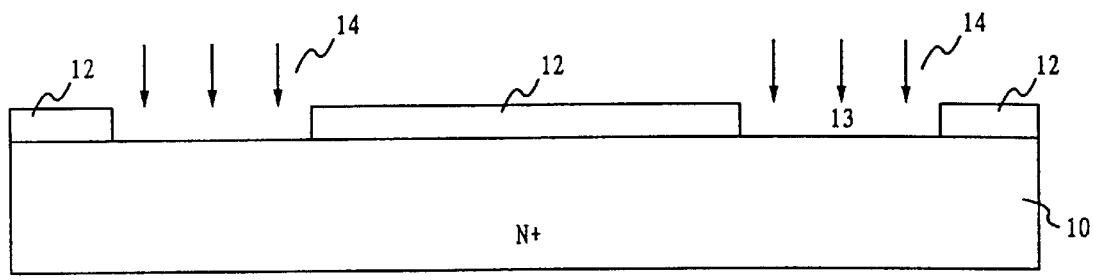
Figure 4:
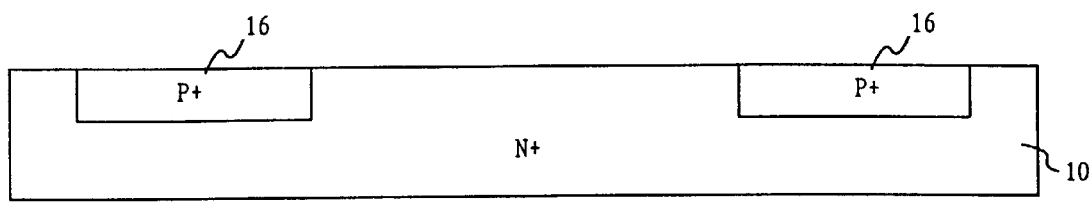

Referring now to FIGS. 2–7, preferred methods of forming insulated gate bipolar transistors (IGBTs) having built-in freewheeling/flyback diodes, will be described. In particular, FIGS. 2–4 illustrate steps of providing a relatively highly doped semiconductor substrate 10 of first conductivity type (e.g., N-type), to be used as a cathode layer, and then forming a patterned mask 12 on a face of the cathode/substrate 10, as illustrated by FIGS. 2–3. The mask 12 may be formed, for example, by thermally oxidizing the face of the cathode/substrate 10 to form a silicon dioxide layer and then selectively etching the silicon dioxide layer using an etching mask and other conventional etching techniques. Preferably, the mask 12 is patterned to have a one or two-dimensional array of circular or polygonal-shaped openings therein (e.g., stripe, square, hexagonal), which expose respective portions of the face of the cathode/substrate 10. Dopants 14 of second conductivity type are then applied to the exposed portions of the face of the cathode/substrate 10. For example, a layer containing boron (e.g., $BBR_3$) may be formed on the exposed portions of the face and used as a source of second conductivity type dopants by diffusing boron into the cathode/substrate 10 at a temperature of about 1200° C. This step of diffusing second conductivity type dopants is preferably performed to form an array of emitter regions 16 (shown as P+) in the cathode/substrate 10, as illustrated by FIG. 4. The second conductivity type dopants are preferably diffused for a sufficient duration so that the thickness of the emitter regions 16 at the conclusion of the diffusion step is greater than about one half the thickness of the cathode/substrate 10. Alternatively, the array of emitter regions 16 can be formed by forming an implant mask on the face of the cathode/substrate 10, implanting second conductivity type dopants 14 into the cathode layer at a predetermined dose and energy level and then diffusing the implanted dopants so that the emitter regions 16 have the desired depth.

Figure 5:
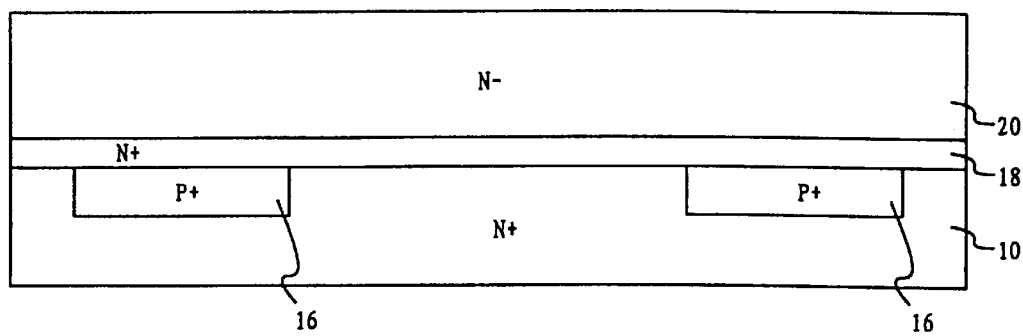

Referring now to FIG. 5, a base region of first conductivity type is then formed on the cathode/substrate 10 and the array of emitter regions 16, as illustrated. The base region may be formed using epitaxial growth techniques, as will be understood by those skilled in the art. In particular, during epitaxial growth, the base region may be in-situ doped at high levels to form a buffer region 18 (shown as N+) and then at lower levels to form a more lightly doped but substantially thicker drift region 20 (shown as N−) on the buffer region 18. The doping levels and thicknesses of the buffer region 18 and drift region 20 can be chosen to meet the requirements of the end use application of the IGBT, including on-state resistance and blocking voltage capability requirements.

Figure 6:
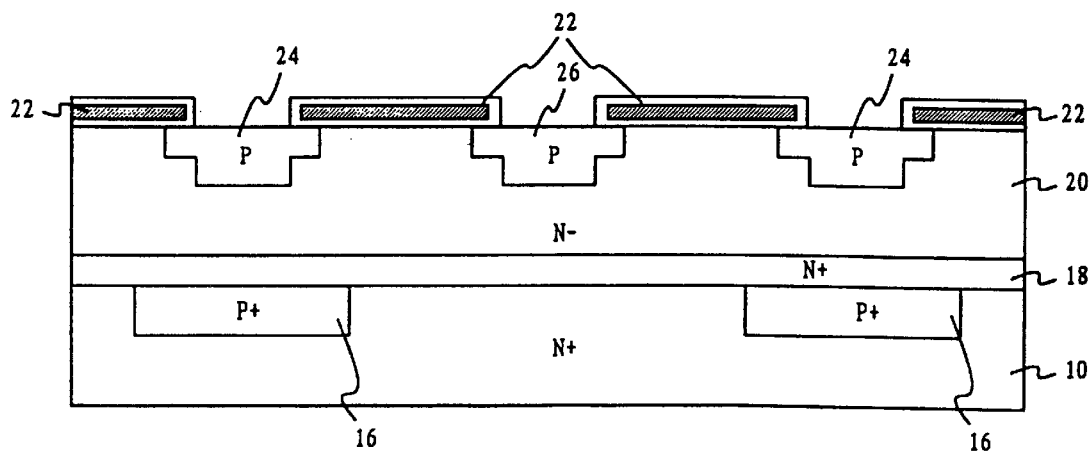

As illustrated best by FIG. 6, an insulated gate electrode 22 is then formed on a face of the base region. Here, the insulated gate electrode pattern 22 may be formed using a sequence of steps, including forming a gate insulating layer of silicon dioxide on the face of the base region, forming a conductive gate electrode on the gate insulating layer, and then patterning the two layers to form an array of circular or polygonal-shaped openings (e.g., stripe, square, hexagonal) which expose the base region. As will be understood by those skilled in the art, the patterned gate layer may be protected using sidewall insulating spacers. The insulated gate electrode 22 is then preferably used as a mask to form self-aligned regions of second conductivity type in the base region. For example, boron ions may be implanted into the exposed portions of the base region at a predetermined dose and energy level, and then diffused vertically and laterally underneath the insulated gate electrode 22, to form an array of collector regions 24 of second conductivity type and a laterally offset array of anode regions 26. When viewed in transverse cross-section, these regions appear as an alternating sequence of collector and anode regions. These arrays of collector regions 24 and anode regions 26 may be patterned as two interleaved two-dimensional arrays of collector and anode regions so that each collector region is surrounded by four anode regions and vice versa. However, the arrays may be patterned differently. For example, the arrays may comprise alternating stripe-shaped fingers of a comb-shaped region of second conductivity type, as will be understood by those skilled in the art.

Figure 7:
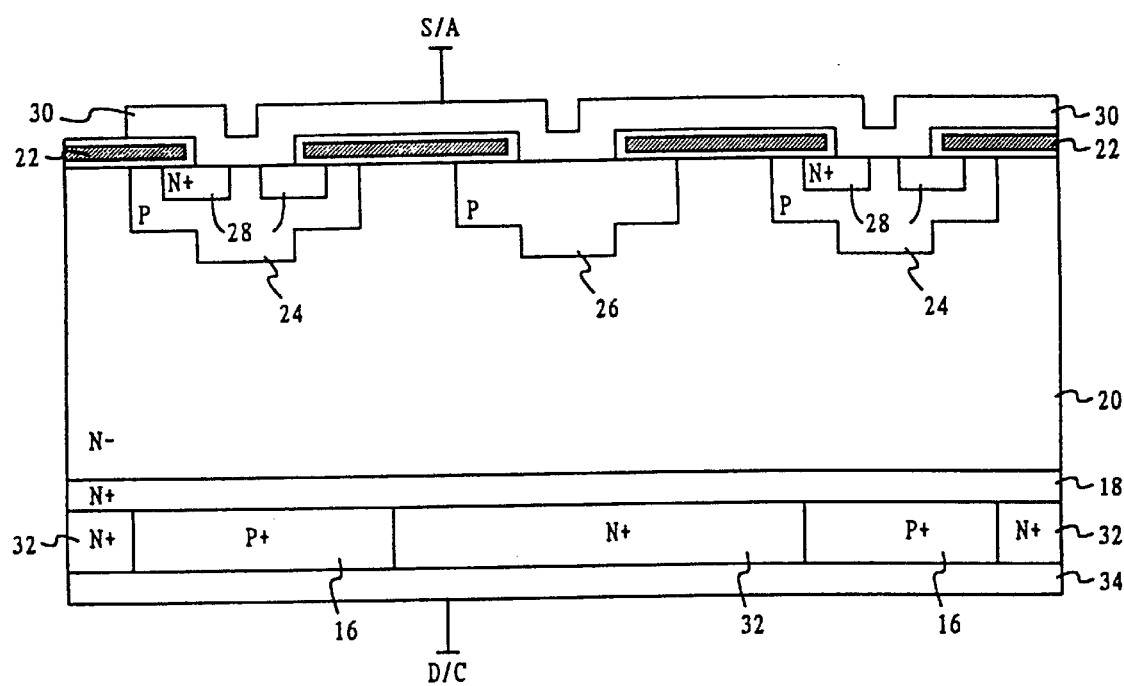

Referring now to FIG. 7, an array of source regions 28 of first conductivity type (e.g., N-type) is preferably formed in the array of collector regions 24, but not in the array of anode regions 26, using well known techniques such as double diffusion techniques. For example, prior to fully diffusing the collector regions 24 into the base region, the source regions 28 can be formed by implanting first conductivity type dopants and then simultaneously diffusing the source and collector region dopants to substantially their full and final depths, as illustrated. During this step, the implanted source and collector region dopants diffuse laterally underneath the insulated gate electrode 22 to form a first lateral field effect transistor having a source in the source region 28 (which may be annular in shape), a drain in the drift region 20 and a channel region therebetween in the collector region 24, as will be understood by those skilled in the art. As illustrated, the insulated gate electrode also extends between adjacent collector and anode regions to form a second lateral field effect transistor having a drain in the collector region and a source in the anode region and a channel region therebetween in the drift region 20.

Referring still to FIG. 7, the cathode/substrate 10 can then be thinned by chemical/mechanical polishing until the array of emitter regions 16 are exposed. At this point, the cathode/substrate 10 will comprise a cathode layer 32 of first conductivity type having a plurality of openings therein which are filled by the emitter regions 16 of second conductivity type. Conventional double-sided metallization techniques can then be performed to complete the IGBT by forming an emitter/cathode electrode 34 in ohmic contact with the cathode layer 32 and emitter regions 16 and forming a source/collector/anode electrode in ohmic contact with the source, collector and anode regions. However, in accordance with the above described method, a plurality of vertical freewheeling/flyback diode cells (e.g., P-i-N cells) are preferably formed between each anode region 26 and a respective opposing portion of the cathode layer 32. Similarly, a plurality of vertical IGBT cells are preferably formed between each collector/source region 24, 28 and a respective opposing emitter region 16. To achieve high integration density, the IGBT and diode cells are preferably arranged as respective interleaved arrays of cells so that when viewed in transverse cross-section, the IGBT cells and diode cells alternate in sequence, as illustrated. Accordingly, when viewed in lateral cross-section, the IGBT and diode cells may appear as a checkerboard pattern of cells.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated power semiconductor device containing interleaved arrays of vertical insulated-gate bipolar transistor cells and vertical diode cells connected in antiparallel, comprising:

a semiconductor substrate having first and second opposing faces;

a cathode region of first conductivity type in said semiconductor substrate, at the first face;

a first array of emitter regions of second conductivity type in said cathode region;

a base region of first conductivity type extending from said cathode region to the second face and forming respective P-N junctions with the emitter regions in said first array;

a second array of collector regions of second conductivity type in said base region, at the second face, said second array of collector regions disposed diametrically opposite said first array of emitter regions to thereby define an array of spaced vertical bipolar transistor cells;

a third array of anode regions of second conductivity type in said base region, at the second face, interleaved within said second array to thereby define an array of spaced vertical diode cells between respective anode regions and said cathode region;

a fourth array of source regions of first conductivity type in said second array of collector regions, but not in said third array of anode regions;

insulated gate electrode means adjacent the second face for electrically connecting said fourth array of source regions to said base region in response to application of a predetermined forward bias thereto;

an electrode at the first face, in ohmic contact with said cathode region and said first array of emitter regions; and an electrode at the second face, in ohmic and physical contact with said second, third and fourth arrays.

2. The semiconductor device of claim 1, wherein said insulated gate electrode means further comprises means for electrically connecting said second array of collector regions to said third array of anode regions by inversion layer channels in said base region, in response to application of a predetermined reverse bias thereto.

3. The semiconductor device of claim 2, wherein said second array of collector regions and said third array of anode regions are formed as an alternating sequence of regions of second conductivity type which extend longitudinally in said semiconductor substrate in parallel with each other.

4. An integrated power semiconductor device containing insulated-gate bipolar transistor cells and vertical diode cells connected in antiparallel, comprising:

a semiconductor substrate having first and second opposing faces;

a cathode region of first conductivity type in said semiconductor substrate, at the first face;

a plurality of emitter regions of second conductivity type in said cathode region;

a base region of first conductivity type extending from said cathode region to the second face and forming respective P-N junctions with said plurality of emitter regions;

a plurality of collector regions of second conductivity type in said base region, at the second face, said plurality of collector regions and emitter regions defining a respective plurality of vertical bipolar junction transistor cells having a common base in said base region;

a plurality of anode regions of second conductivity type in said base region, at the second face, said plurality of anode regions defining a respective plurality of vertical diode cells electrically connected in antiparallel with said plurality of vertical bipolar junction transistor cells;

at least one source region of first conductivity type in each of said plurality of collector regions, but not in said plurality of anode regions;

insulated gate electrode means adjacent the second face for electrically connecting said source regions to said base region in response to application of a predetermined forward gate bias thereto;

an electrode at the first face, in ohmic contact with said cathode region and said emitter regions; and an electrode at the second face, in ohmic and physical contact with said collector, source and anode regions.

5. The semiconductor device of claim 4, wherein each of said collector regions is disposed diametrically opposite a respective one of said emitter regions.

6. The semiconductor device of claim 4, wherein said insulated gate electrode means also comprises means for electrically connecting said collector regions to said anode regions by inversion layer channels in said base region, in response to application of a predetermined reverse gate bias thereto.

* * * * *